(12) United States Patent
Fujiwara

(10) Patent No.: US 9,960,788 B2
(45) Date of Patent: May 1, 2018

(54) MEMORY CONTROLLER, SEMICONDUCTOR MEMORY DEVICE, AND CONTROL METHOD FOR SEMICONDUCTOR MEMORY DEVICE

(71) Applicant: Toshiba Memory Corporation, Minato-ku (JP)

(72) Inventor: Daisuke Fujiwara, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 45 days.

(21) Appl. No.: 14/847,607

(22) Filed: Sep. 8, 2015

(65) Prior Publication Data

US 2016/0285478 A1    Sep. 29, 2016

Related U.S. Application Data

(60) Provisional application No. 62/139,239, filed on Mar. 27, 2015.

(51) Int. Cl.
*H03M 13/15* (2006.01)
*H03M 13/29* (2006.01)
*G06F 11/10* (2006.01)
*G11C 29/04* (2006.01)

(52) U.S. Cl.
CPC ..... *H03M 13/1595* (2013.01); *G06F 11/1012* (2013.01); *H03M 13/159* (2013.01); *H03M 13/2909* (2013.01); *G11C 2029/0411* (2013.01)

(58) Field of Classification Search
CPC .......... H03M 13/1595; H03M 13/159; H03M 13/2909
See application file for complete search history.

(56) References Cited

U.S. PATENT DOCUMENTS

| | | | | |
|---|---|---|---|---|
| 4,105,999 A * | 8/1978 | Nakamura | ............ | H03M 13/15 714/757 |
| 4,282,551 A * | 8/1981 | Kanazawa | ......... | G11B 20/1813 360/32 |
| 4,413,339 A * | 11/1983 | Riggle | ................ | H03M 13/151 714/765 |
| 4,809,273 A * | 2/1989 | Jackowski | .......... | G06F 11/2215 714/703 |
| 5,107,506 A * | 4/1992 | Weng | .................... | H03M 13/15 714/761 |
| 5,280,488 A * | 1/1994 | Glover | ............... | G11B 20/1833 714/762 |
| 5,282,215 A * | 1/1994 | Hyodo | .................... | H04L 7/048 714/757 |

(Continued)

FOREIGN PATENT DOCUMENTS

| | | |
|---|---|---|
| JP | 2605270 | 4/1997 |
| JP | 2014-116659 | 6/2014 |

*Primary Examiner* — Joseph D Torres
(74) *Attorney, Agent, or Firm* — Oblon, McClelland, Maier & Neustadt, L.L.P.

(57) ABSTRACT

A memory controller is a memory controller including an encoder that product-codes, with a linear code, data to be recorded in a memory section and a decoder that decodes product-coded data read out from the memory section. The encoder and the decoder share a parity generation circuit including a plurality of remainder calculating and retaining sections, each including a remainder calculation circuit by a generator polynomial and a retaining circuit that retains an output of the remainder calculation circuit.

14 Claims, 7 Drawing Sheets

(56) References Cited

U.S. PATENT DOCUMENTS

| | | | | |
|---|---|---|---|---|
| 5,771,249 | A * | 6/1998 | Yanagisawa | H04L 7/048 |
| | | | | 370/509 |
| 5,991,911 | A * | 11/1999 | Zook | G11B 20/1833 |
| | | | | 714/755 |
| 6,523,053 | B1 * | 2/2003 | Lee | G06F 7/726 |
| | | | | 708/492 |
| 6,530,057 | B1 * | 3/2003 | Kimmitt | H03M 13/091 |
| | | | | 708/492 |
| 8,954,828 | B2 | 2/2015 | Torii et al. | |
| 2001/0023497 | A1 * | 9/2001 | Seki | H03M 13/1515 |
| | | | | 714/784 |
| 2003/0101406 | A1 * | 5/2003 | Song | H03M 13/00 |
| | | | | 714/774 |
| 2003/0159101 | A1 * | 8/2003 | Hyland | G06F 11/10 |
| | | | | 714/781 |
| 2004/0078410 | A1 * | 4/2004 | Porten | G06F 7/724 |
| | | | | 708/492 |
| 2004/0078555 | A1 * | 4/2004 | Porten | G06F 9/30018 |
| | | | | 712/221 |
| 2005/0097432 | A1 * | 5/2005 | Obuchi | H03M 13/091 |
| | | | | 714/800 |
| 2008/0022185 | A1 * | 1/2008 | Kiryu | H03M 13/091 |
| | | | | 714/759 |
| 2008/0123408 | A1 * | 5/2008 | Honma | G06F 11/1072 |
| | | | | 365/185.03 |
| 2011/0185265 | A1 * | 7/2011 | Cherukuri | H03M 13/152 |
| | | | | 714/782 |

* cited by examiner

MEMORY CONTROLLER, SEMICONDUCTOR MEMORY DEVICE, AND CONTROL METHOD FOR SEMICONDUCTOR MEMORY DEVICE

FIELD

An embodiment described herein relates generally to a memory controller including an encoder that subjects data recorded in a memory section to product-coding processing and a decoder that subjects product-coded data recorded in the memory section to decoding processing, a semiconductor memory device including the memory controller, and a control method for the semiconductor memory device.

BACKGROUND

Developments concerning error correction codes of data have been actively performed for high-density recording of a semiconductor memory device that records digital data in a NAND flash memory section.

An error correction code is given to data by an error-code generation circuit (an encoder) before recording. It is detected whether an error is present in data read out by an error detection and correction circuit (a decoder). When an error is present, the data is corrected.

A correction ability can be increased by increasing the number of bits of the error correction code. However, a circuit size increases and processing speed decreases. Further, various errors such as a random error, a burst error, and a mixed error of the random error and the burst error occur.

In order to efficiently perform appropriate error correction, it is effective to use two or more codes in combination. As a combining method for the codes, there is known a product code in which linear codes having a relatively small correction ability, for example, BCH (Bose-Chaudhuri-Hocquenghem) codes are arrayed in n dimensions.

A two-dimensional product-code is explained with reference to FIG. 1. In coding processing, data of (M×N) bits are arrayed as N data segmented in units of M bits (a block 1). First, coding by a correction code C1 is applied to each of data of M bits in a row direction. That is, a correction code C1 (a C1 parity) of P bits is added to each of the data of M bits. Consequently, N pieces of C1 coded data having a code length of P bits are formed. The number of bits of the entire correction code C1 (the C1 parity) is P×N (a block 2).

Subsequently, coding in a column direction in which C1 coded data (the block 1+the block 2) of ((M+P)×N) bits are segmented in units of N bits is performed. In the coding, a correction code C2 (a C2 parity) of Q bits is added to each of data of N bits. The number of bits of the entire correction code C2 (the C2 parity) is (M+P)×Q (a block 3). Consequently, a product-coded data of ((M+P)×(N+Q)) bits as a whole is formed. FIG. 1 is an example in which the size of a crossing section of a row and a column is 1. However, in some case, the crossing section size is larger than 1.

In decoding processing of the product code, it is necessary to alternately iterate decoding in the row direction and the column direction. For example, first, decoding in the row direction is performed. However, if uncorrectable data is present, the data is not changed. Subsequently, decoding in the column direction is performed on the basis of data corrected in the decoding in the row direction. If uncorrectable data is present, the data is not changed. The decoding in the row direction is performed again on the basis of the data corrected in the decoding in the column direction. Data uncorrectable in the row-direction decoding of the last time is sometimes corrected. Similarly, the next decoding in the column direction is performed on the basis of the corrected data. This iterative process continues until the entire data is corrected or the data is determined as uncorrectable.

DETAILED DESCRIPTION

First, schematic configurations of a memory controller 2 and a memory card 3, which is a semiconductor memory device including the memory controller 2, in an embodiment of the present invention are explained with reference to FIG. 2.

Figure 2:
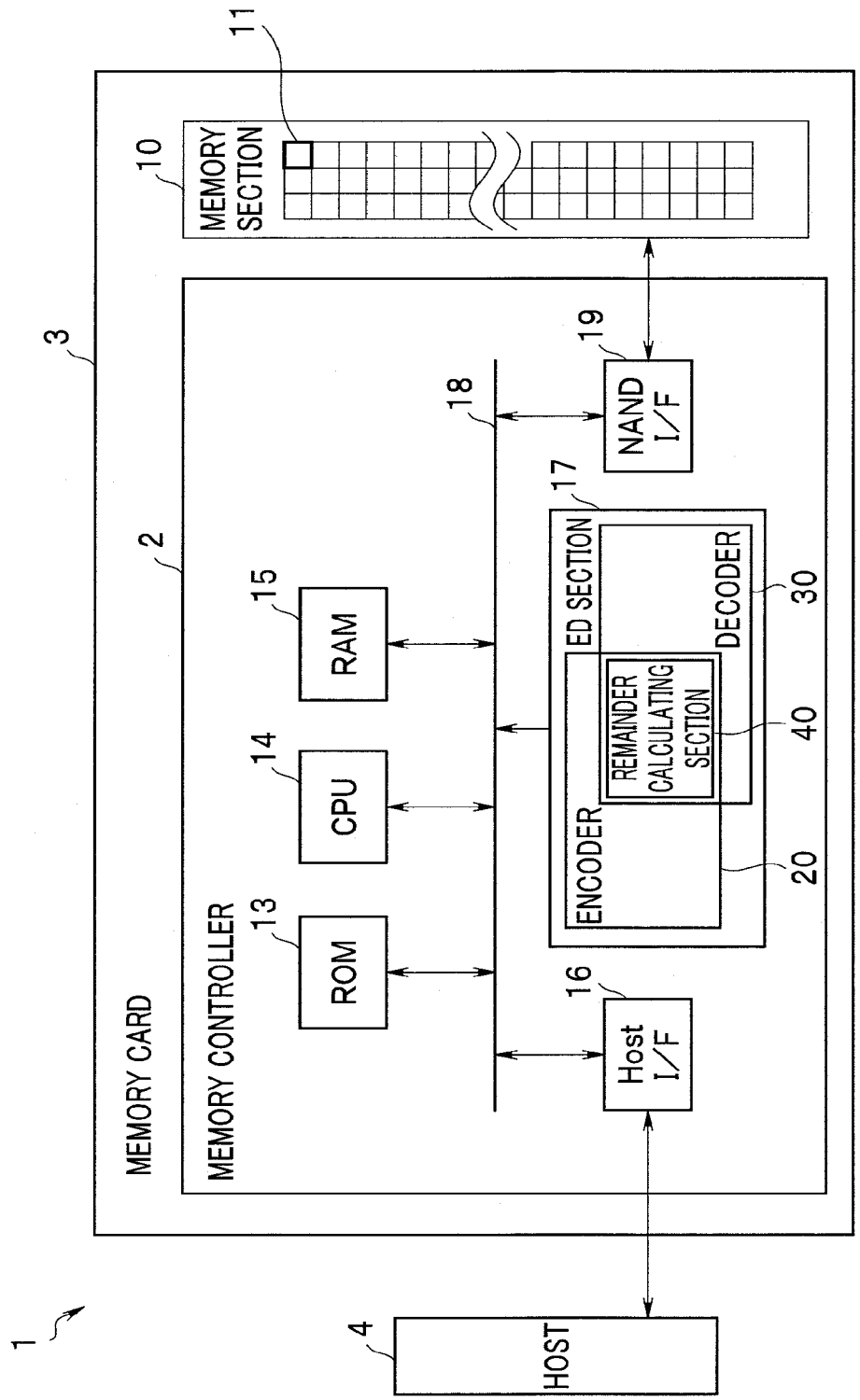
FIG. 2 is a configuration diagram showing a schematic configuration of a memory card including the memory controller in the embodiment.

As shown in FIG. 2, the memory card 3 in the embodiment of the present invention records data received from a host 4 such as a personal computer or a digital camera and transmits the recorded data to the host 4. The memory card 3 includes a semiconductor memory section (hereinafter simply referred to as "memory section" as well) 10 and a memory controller 2. The memory section 10 is configured from a NAND flash memory and includes a larger number of memory cells 11, which are unit cells. The memory cell 11 may be a multi-value memory in which a plurality of bits are recorded.

The memory controller 2 includes a ROM 13, a CPU 14, which is a control section, a RAM 15, a host I/F (interface) 16, an E/D (encoder/decoder) section 17, and a NAND I/F (interface) 19, each of which is connected via a bus 18.

The memory controller 2 performs data transmission and reception with the host 4 via the host I/F 16 and performs data transmission and reception with the memory section 10 via the NAND I/F 19 using the CPU 14. The memory controller 2 realizes address management of the memory section 10 with FW (firmware) executed by the CPU 14. Control of the entire memory card 3 corresponding to a command input from the host 4 is also executed by the FW in the CPU 14. The ROM 13 records, for example, a control program of the memory card 3. In the RAM 15, for example, an address conversion table necessary in address management is recorded.

The ED section 17 includes an encoder 20 that performs encoding processing for generating and giving an error correction code during data recording and a decoder 30 that performs decoding processing for read-out encoded data during data readout. Note that the ED section 17 may include an SRAM that temporarily stores data during processing.

In the memory controller 2 of the memory card 3, the encoder 20 and the decoder 30 of the ED section 17 share a remainder calculating section 40, which is a parity generation circuit.

The ED section 17 uses a BCH (Bose-Chaudhuri-Hocquenghem) code, which is a linear code, or a Reed Solomon (RS) code, which is a linear block code of the BCH code.

Both of the BCH code and the Reed Solomon code are codes configured using characteristics of a primitive polynomial on a Galois field and a root of the primitive polynomial. However, the BCH code and the Reed Solomon code are different in that, whereas the BCH code treats information with one bit as a unit and an error correction code is also generated in bit units, the Reed Solomon code treats data with, for example, 8 bits=1 byte as a unit and an error correction code is also generated in byte units.

Figure 1:
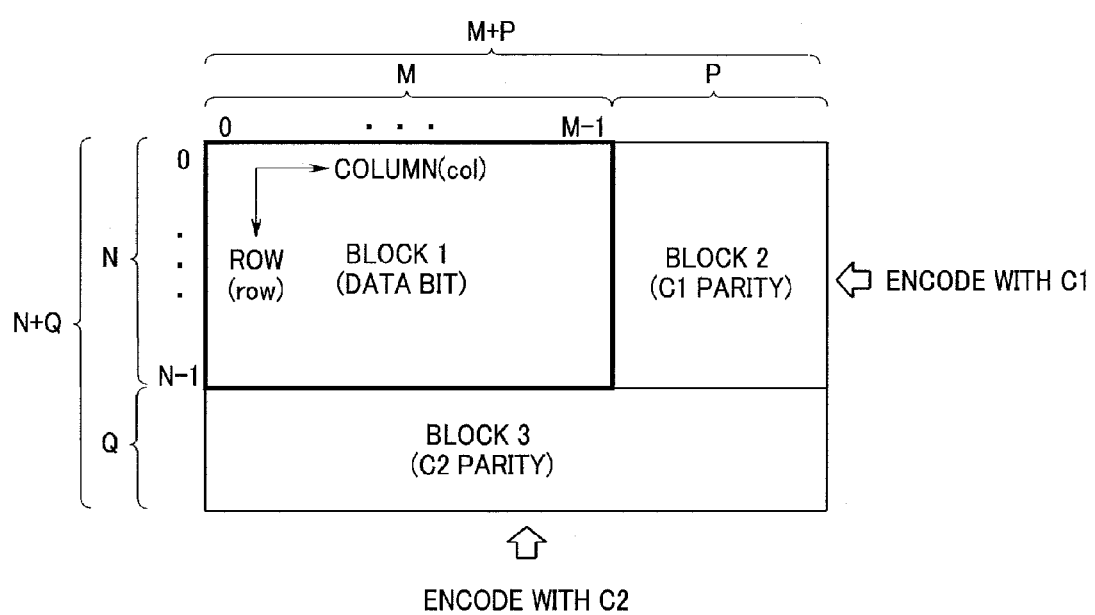
FIG. 1 is a diagram for explaining a product code of a memory controller in an embodiment.

In the following explanation, an example is explained in which the ED section 17 performs coding/decoding by a two-dimensional BCH product code shown in FIG. 1.

Figure 3:
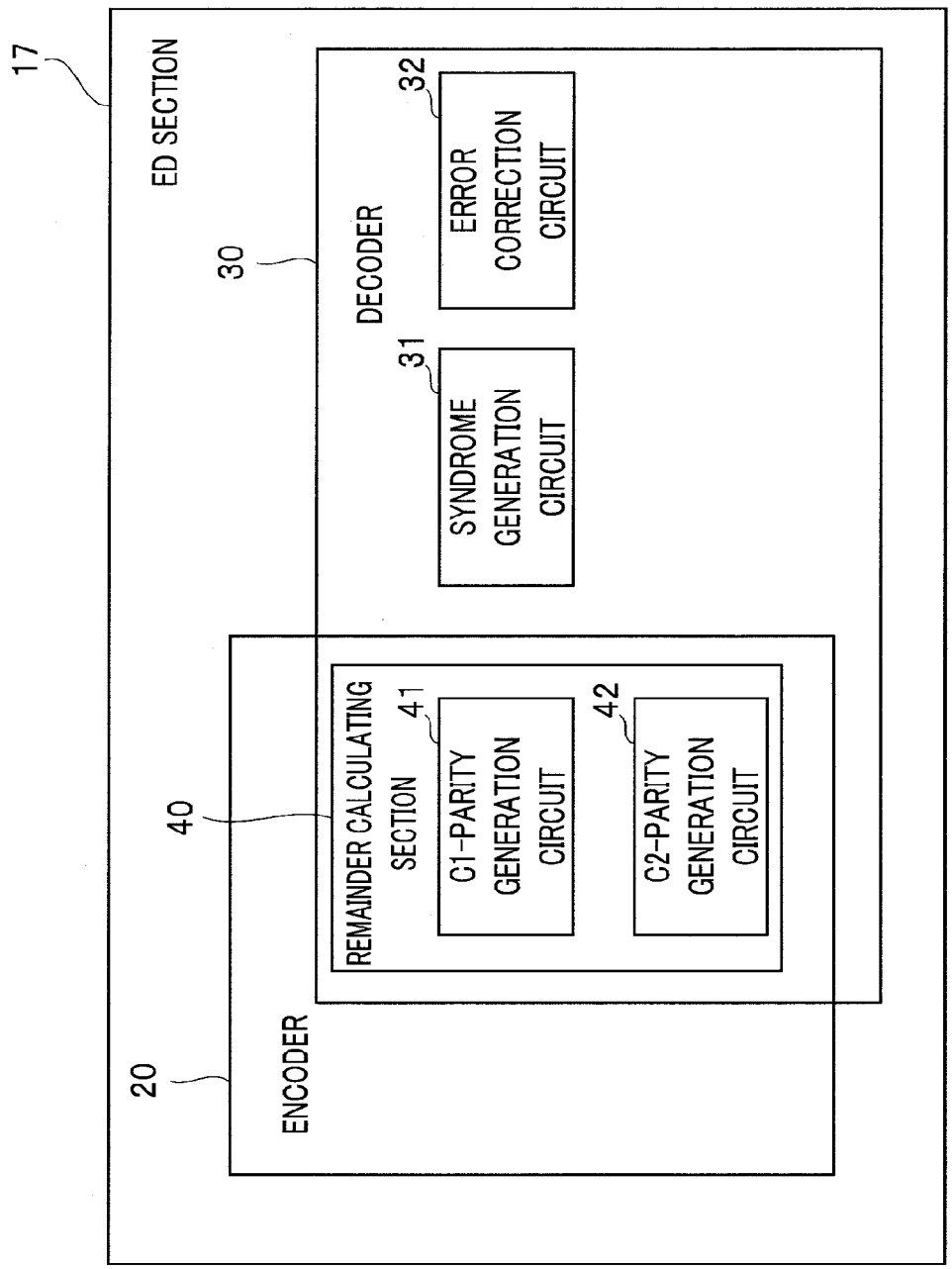
FIG. 3 is a configuration diagram of an ED section of the memory controller in the embodiment.

As shown in FIG. 3, the remainder calculating section 40 includes a C1-parity generation circuit 41 by the correction code C1 and a C2-parity generation circuit 42 by the correction code C2. The decoder 30 includes a syndrome generation circuit 31 that generates a syndrome from a C2 parity generated by the C1-parity generation circuit 41 and the C2-parity generation circuit 42 and an error correction circuit 32 that detects an error position from the syndrome and corrects an error.

Figure 4:
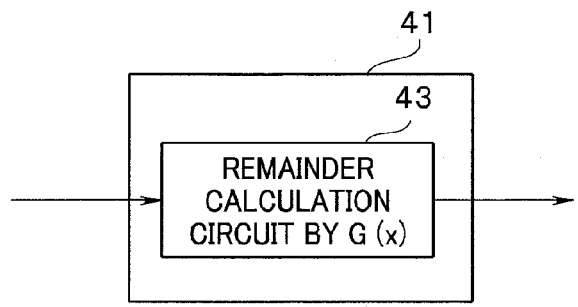
FIG. 4 is a configuration diagram of a C1-parity generation circuit of the memory controller in the embodiment.

As shown in FIG. 4, the C1-parity generation circuit 41 includes a remainder calculation circuit 43 by a generator polynomial G (x). The remainder calculation circuit 43 by the generator polynomial G (x) is realized by a linear feedback shift register (LFSR) or a combinational circuit.

The generator polynomial G (x) used during 5-bit correction indicated by Equation 1 is explained below as an example. In the Equation, $M_1$ (x) to $M_9$ (x) are referred to as minimal polynomials.

$$G(x)=M_1(x) \times M_3(x) \times M_5(x) \times M_7(x) \times M_9(x) \tag{1}$$

Figure 5:
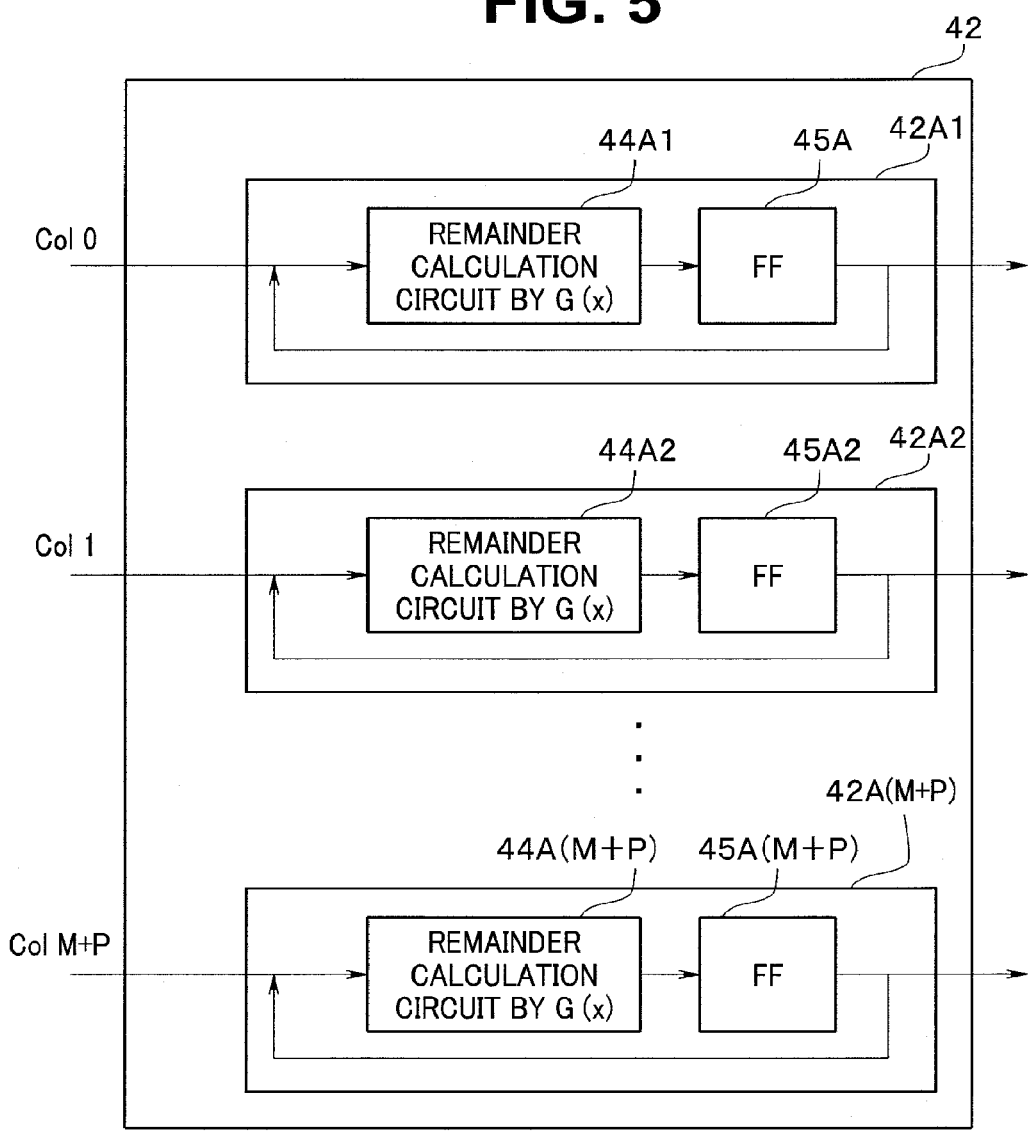
FIG. 5 is a configuration diagram of a C2-parity generation circuit of the memory controller in the embodiment.

As shown in FIG. 5, the C2-parity generation circuit 42 includes remainder calculation retaining circuits 42A (42A1 to 42A (M+P)) of (M+P) sets by the generator polynomials G (x). Like the C1-parity generation circuit, remainder calculation circuits 44A (44A1 to 44A (M+P)) by the generator polynomial G (x) are realized by LFSRs or combinational circuits. The remainder calculation retaining circuits 42A include the remainder calculation circuits 44A (44A1 to 44A (M+P)) by the generator polynomial G (x) and flip-flops (FFs) 45A (45A1 to 45A (M+P)), which are retaining circuits that retain outputs of the remainder calculation circuits 44A. Like the remainder calculation circuit 43, the remainder calculation circuits 44A perform a division by the generator polynomial G (x) and calculate a remainder. When the processing of the C1-parity generation circuit 41 is completed, the C2 parity is retained in the FF 45.

Figure 6:
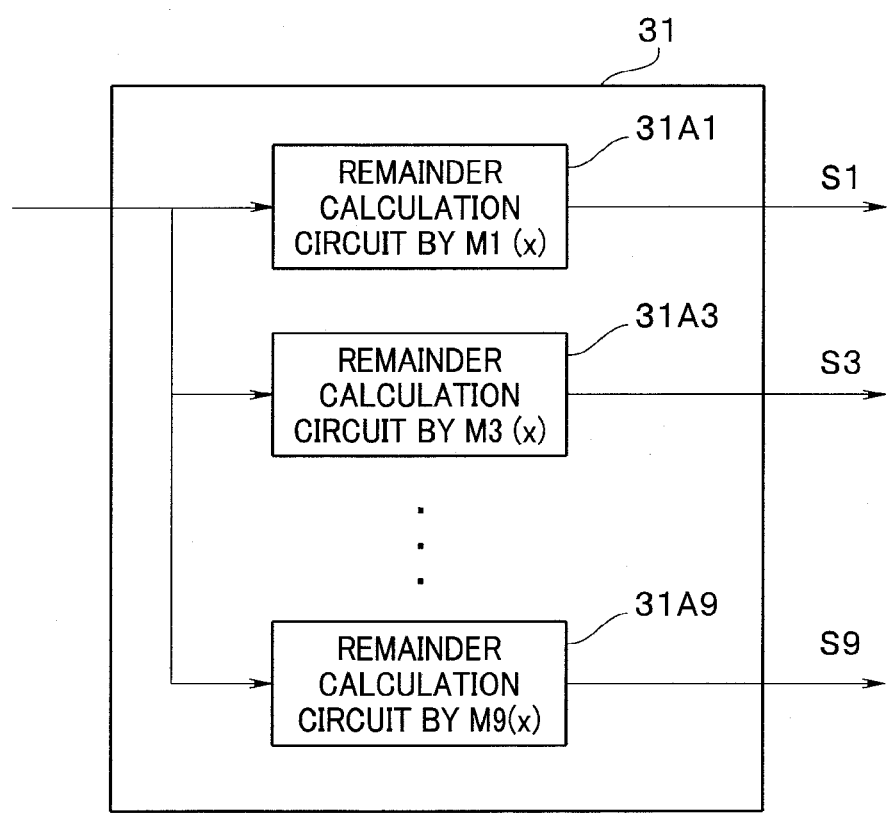
FIG. 6 is a configuration diagram of a syndrome generation circuit of the memory controller in the embodiment.

As shown in FIG. 6, the syndrome generation circuit 31 includes remainder calculation circuits 31A (31A1 to 31A9) by the minimal polynomials $M_1$ (x) to $M_9$ (x). The remainder calculation circuits 31A are realized by LFSRs or combinational circuits. The remainder calculation circuits 31A1 to 31A9 generate syndromes S1 to S9.

In the memory controller 2 of the memory card 3, since the C2-parity generation circuit 42 includes the FF 45, when the C1 parity generation is completed, the C2 parity generation is also completed. Therefore, the memory controller 2 performs coding processing and decoding processing faster than the conventional memory controller 2 that performs operation by iterative processing.

Since the C2-parity generation circuit 42 includes the (M+P) sets of remainder calculation retaining circuits 42A, the circuit size of the C2-parity generation circuit 41 is large.

However, in the memory controller 2, since the encoder 20 and the decoder 30 share the C2-parity generation circuit 42, the circuit size of the memory controller 2 is reduced.

Note that, in the memory controller 2, the encoder 20 and the decoder 30 also share the C1-parity generation circuit 41. Since the C1-parity generation circuit 41 has a small circuit size compared with the C2-parity generation circuit 42, the encoder 20 and the decoder 30 may respectively include C1-parity generation circuits.

A principle of the decoder 30 that decodes a reception polynomial P (x) based on product-coded data read out from the memory section 10 is briefly explained.

The C2-parity generation circuit 42 divides the reception polynomial P (x) by the generator polynomial G (x).

$$P(x)=G(x) \times Q(x)+R(x) \tag{2}$$

Q (x) is a quotient and R (x) is a remainder.

The syndrome generation circuit 31 divides the remainder R (x) by the minimal polynomial $M_1$ (x).

$$R(x)=M_1(x) \times Q_1(x)+R_1(x) \tag{3}$$

Q (x) is a quotient and $R_1$ (x) is a remainder.

From Equation 2 and Equation 3, Equation 4 is obtained.

$$P(x)=G(x) \times Q(x)+M_1(x) \times Q_1(x)+R_1(x) \tag{4}$$

Given Equation 1, that is, $$G(x)=M_1(x) \times M_3(x) \times M_5(x) \times M_7(x) \times M_9(x),$$

Equation 5 is obtained.

$$P(x)=M_1(x) \times M_3(x) \times M_5(x) \times M_7(x) \times M_9(x) \times Q(x)+M_1(x) \times Q_1(x)+R_1(x) \tag{5}$$

If Q' (x)={$(M_3$ (x)$\times M_5$ (x)$\times M_7$ (x)$\times M_9$ (x)$\times Q$ (x)+$Q_1$ (x)}, Equation 6 is obtained.

$$P(x)=M_1(x) \times Q'(x)+R_1(x) \tag{6}$$

Equation 6 indicates that a remainder obtained by dividing the reception polynomial P (x) by $M_1$ (x) is $R_1$ (x). The same applies to $M_3$ (x), $M_5$ (x), $M_7$ (x), and $M_9$ (x).

Figure 7:
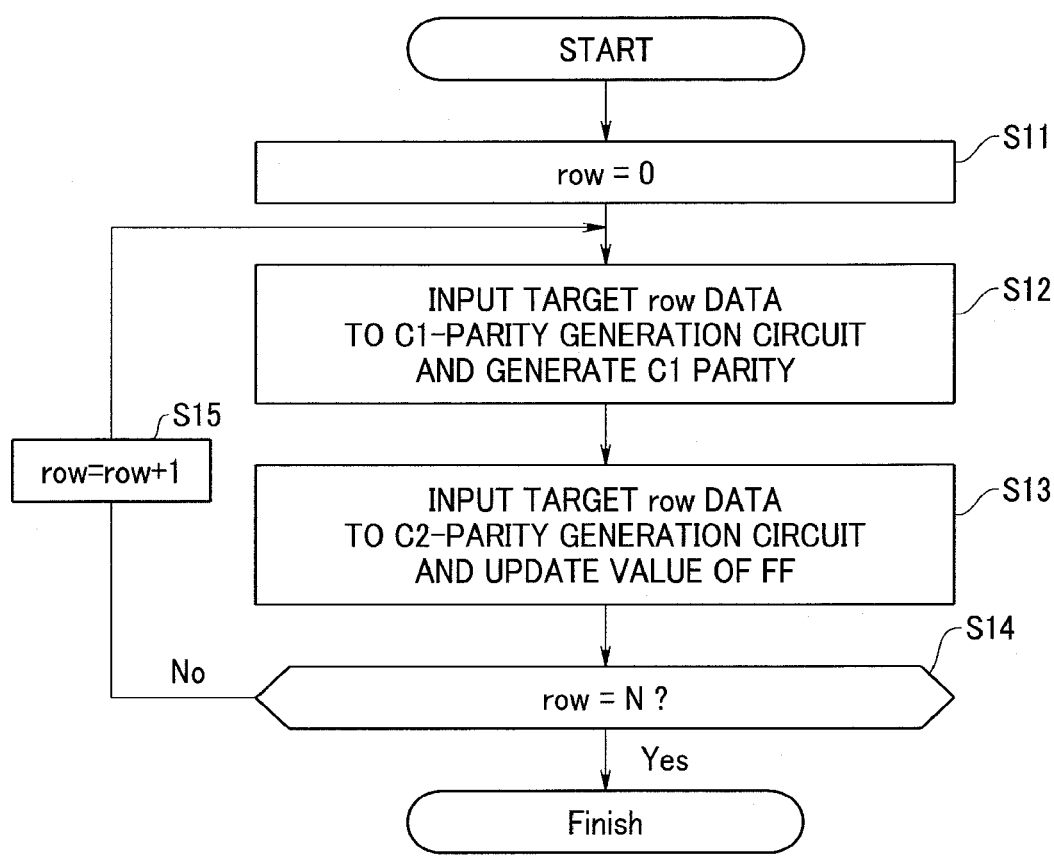
FIG. 7 is a flowchart for coding processing of the memory controller in the embodiment.
Figure 8:
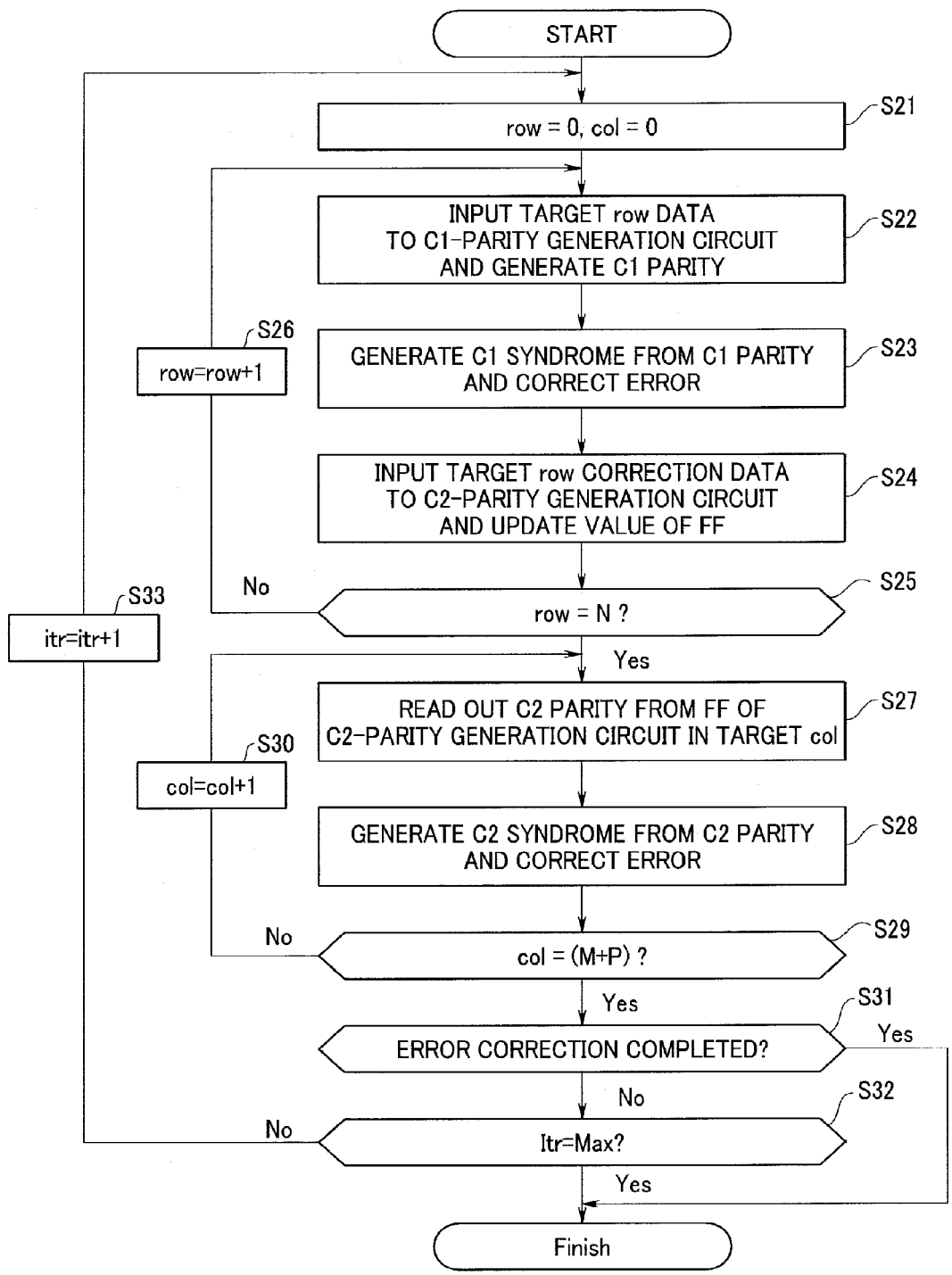
FIG. 8 is a flowchart of decoding processing of the memory controller in the embodiment.

Operation of the memory controller in the embodiment is explained according to flowcharts of FIGS. 7 and 8.

First, coding processing is explained according to the flowchart of FIG. 7.

Step S11

A row number is set to 0.

Step S12

Data of a target row is input to the C1-parity generation circuit 41 and a C1 parity is generated.

Step S13

Data of a target column is input to the C2-parity generation circuit 42 and a value of the FF 45 is updated.

Step S14

When the row number is N (Yes), the processing is completed.

Step S15

When the row number is not N in S14 (No), 1 is added to a target row number and the processing is iterated from S12.

When the processing is completed, that is, when processing of data in N rows is completed, the value retained in the FF 45 of the C2-parity generation circuit 42 changes to a C2 parity.

Decoding processing is explained according to the flowchart of FIG. 8.

Step S21

A column number and a row number are set to 0. Note that the number of times of iteration (Itr) is set to 1.

Step S22

Data of a target column is input to the C1-parity generation circuit 41 and a C1 parity is generated.

Step S23

A C1 syndrome is generated from the C1 parity by the syndrome generation circuit 31. If an error position is specified from the C1 syndrome, an error is corrected.

Step S24

Correction data of a target row is input to the C2-parity generation circuit 42 and the value of the FF 45 is updated.

When the row number is N (Yes), C1 correction processing in the first time of the number of times of iteration (Itr) is completed.

Step S25

When the row number is not N (No), in step S26, 1 is added to a target row number and the processing is iterated from S22.

Step S27

When row processing is completed in S25 (Yes), column processing is performed. That is, a C2 parity is read out from the FF 45 of the C2-parity generation circuit 42 of the target column.

Step S28

A C2 syndrome is generated from a C2 parity of the target row by the syndrome generation circuit 31. If an error position is specified from the C2 syndrome, an error is corrected.

Step S29

When the column number is not (M+P) (No), in step S30, 1 is added to a target column number and the processing is iterated from S27.

Step S31

When the column number is (M+P) in S29 (Yes), it is determined whether all errors are corrected. Note that completion of the error correction may be checked by adding a CRC parity to the end of information bits.

Step S32

When the error correction is not completed in S32, in step S33, 1 is added to the number of times of iteration Itr. The processing is iterated from step S21 until the number of times of iteration Itr reaches a predetermined set number of times Max.

As explained above, in the memory controller 2 in the embodiment, when the C1 parity calculation by the C1 code is completed, the C2 parity calculation by the C2 code is also completed. Therefore, processing is fast. The retaining circuit in which the C2 parity is retained is the flip-flop. Therefore, a circuit configuration is simple. Further, the encoder and the decoder share the C2-parity generation circuit including the remainder calculation circuit (LFSR) of the generator polynomial and the retaining circuit FF that retains an output of the remainder calculation circuit. Therefore, a circuit size is reduced.

Note that, in the above explanation, both of the first code C1 and the second code C2 are the BCH codes. However, the first code C1 and the second code C2 may be either the BCH codes or the RS codes. However, the first code C1 is particularly preferably the BCH code faster in processing than the RS code. This is because, when all errors can be corrected in decoding by the first code C1, decoding by the second code C2 is unnecessary.

In the above explanation, the column processing is performed after the row processing. However, the column processing may be performed first. The two-dimensional product code is explained as the example above. However, the two-dimensional product code can be expanded to an n-dimensional product code (N>3).

In the above explanation, the memory card 3 connected to the host 4 is explained as the example of the semiconductor memory device. The same effects as the effects of the memory card 3 or the like can be obtained by a NAND flash memory device of a so-called embedded type (a so-called silicon disk drive: SSD) or the like that is housed on the inside of the host 4 and records start data or the like of the host 4. The memory section 10 may be a NOR flash memory, a magnetoresistive random access memory (MRAM), a resistive random access memory (ReRAM), or the like as long as the memory section 10 includes a nonvolatile memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
an encoder that product-codes, with a linear code, data to be recorded in a memory section, the product code being a two-dimensional product code by a first code and a second code;
a decoder that decodes product-coded data read out from the memory section;
a first parity generation circuit that performs coding processing by the first code, generates a parity of the first code, and includes a plurality of remainder calculating and retaining sections, each including a remainder calculation circuit based on a generator polynomial and a retaining circuit that retains an output of the remainder calculation circuit; and
a second parity generation circuit that is shared by the encoder and the decoder, performs coding processing by the second code, and generates a parity of the second code, wherein
the coding processing by the second code is performed together with the coding processing by the first code,
the parity of the second code is retained in each retaining circuit,
decoding processing by the second code is performed together with decoding processing by the first code,
the remainder calculation circuit is a linear feedback register, and
the retaining circuit is a flip-flop.

2. The memory controller according to claim 1, wherein the decoder includes a syndrome generation circuit that divides the parity of the second code retained in each retaining circuit by a minimal polynomial of the generator polynomial.

3. The memory controller according to claim 2, wherein the encoder and the decoder further share the first parity generation circuit.

4. The memory controller according to claim 2, wherein the first code and the second code are BCH codes.

5. The memory controller according to claim 2, wherein the first code is a BCH code and the second code is a Reed Solomon code.

6. The memory controller according to claim 2, wherein the memory section is a NAND flash memory, a NOR flash memory, a magnetoresistive random access memory, or a resistive random access memory.

7. The memory controller according to claim 6, wherein a memory cell of the memory section is a multi-value memory.

8. A semiconductor memory device comprising:
a memory section; and
a memory controller including:
an encoder that product-codes, with a linear code, data to be recorded in the memory section, the product code being a two-dimensional product code by a first code and a second code,
a decoder that decodes product-coded data read out from the memory section,
a first parity generation circuit that performs coding processing by the first code, generates a parity of the first code, and includes a plurality of remainder calculating and retaining sections, each including a remainder calculation circuit based on a generator polynomial and a retaining circuit that retains an output of the remainder calculation circuit; and,
a second parity generation circuit that is shared by the encoder and the decoder, performs coding processing by the second code, and generates a parity of the second code, wherein
the coding processing by the second code is performed together with the coding processing by the first code, the parity of the second code is retained in each retaining circuit,
decoding processing by the second code is performed together with decoding processing by the first code,
the remainder calculation circuit is a linear feedback register, and
the retaining circuit is a flip-flop.

9. The semiconductor memory device according to claim 8, wherein
the decoder includes a syndrome generation circuit that divides the parity of the second code retained in each retaining circuit by a minimal polynomial of the generator polynomial.

10. The semiconductor memory device according to claim 9, wherein the encoder and the decoder further share the first parity generation circuit.

11. The semiconductor memory device according to claim 9, wherein the first code and the second code are BCH codes.

12. The semiconductor memory device according to claim 9, wherein the first code is a BCH code and the second code is a Reed Solomon code.

13. The semiconductor memory device according to claim 9, wherein the memory section is a NAND flash memory, a NOR flash memory, a magnetoresistive random access memory, or a resistive random access memory.

14. The semiconductor memory device according to claim 13, wherein a memory cell of the memory section is a multi-value memory.

* * * * *